United States Patent
Wang et al.

(10) Patent No.: US 10,475,890 B2
(45) Date of Patent: Nov. 12, 2019

(54) SCALED MEMORY STRUCTURES OR OTHER LOGIC DEVICES WITH MIDDLE OF THE LINE CUTS

(71) Applicant: GLOBALFOUNDRIES INC., Grand Cayman (KY)

(72) Inventors: Haiting Wang, Clifton Park, NY (US); Wei Zhao, Fort Lee, NJ (US); Hui Zang, Guilderland, NY (US); Hong Yu, Rexford, NY (US); Zhenyu Hu, Clifton Park, NY (US); Scott Beasor, Greenwich, NY (US); Erik Geiss, Mechanicville, NY (US); Jerome Ciavatti, Mechanicville, NY (US); Jae Gon Lee, Waterford, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 18 days.

(21) Appl. No.: 15/728,070

(22) Filed: Oct. 9, 2017

(65) Prior Publication Data
US 2019/0109197 A1 Apr. 11, 2019

(51) Int. Cl.
| | |
|---|---|
| H01L 29/417 | (2006.01) |
| H01L 27/11 | (2006.01) |
| H01L 27/088 | (2006.01) |
| H01L 27/092 | (2006.01) |
| H01L 29/78 | (2006.01) |
| H01L 29/66 | (2006.01) |
| H01L 21/8234 | (2006.01) |
| H01L 21/8238 | (2006.01) |

(52) U.S. Cl.
CPC ........... *H01L 29/41791* (2013.01); *H01L 21/823431* (2013.01); *H01L 21/823821* (2013.01); *H01L 27/0886* (2013.01); *H01L 27/0924* (2013.01); *H01L 27/1104* (2013.01); *H01L 29/66795* (2013.01); *H01L 29/785* (2013.01)

(58) Field of Classification Search
None
See application file for complete search history.

(56) References Cited

U.S. PATENT DOCUMENTS

| | | | |
|---|---|---|---|
| 7,692,254 B2 | 4/2010 | Anderson et al. | |
| 8,878,300 B1* | 11/2014 | Liu | ........ H01L 29/785 257/368 |
| 2015/0035023 A1* | 2/2015 | Kim | ........ H01L 29/785 257/288 |
| 2015/0325692 A1 | 11/2015 | Zang | |
| 2015/0364593 A1* | 12/2015 | Jangjian | ........ H01L 29/785 257/401 |
| 2017/0098711 A1* | 4/2017 | Hsiao | ........ H01L 21/30604 |
| 2017/0221891 A1* | 8/2017 | Chen | ........ H01L 27/0886 |

* cited by examiner

*Primary Examiner* — Mounir S Amer
(74) *Attorney, Agent, or Firm* — Anthony Canale; Andrew M. Calderon; Roberts Mlotkowski Safran Cole & Calderon, P.C.

(57) ABSTRACT

The present disclosure relates to semiconductor structures and, more particularly, to scaled memory structures with middle of the line cuts and methods of manufacture The structure comprises: a plurality of fin structures formed on a substrate; a plurality of gate structures spanning over adjacent fin structures; a cut in adjacent epitaxial source/drain regions; and a cut in contact material formed adjacent to the plurality of gate structures, which provides separate contacts.

14 Claims, 5 Drawing Sheets

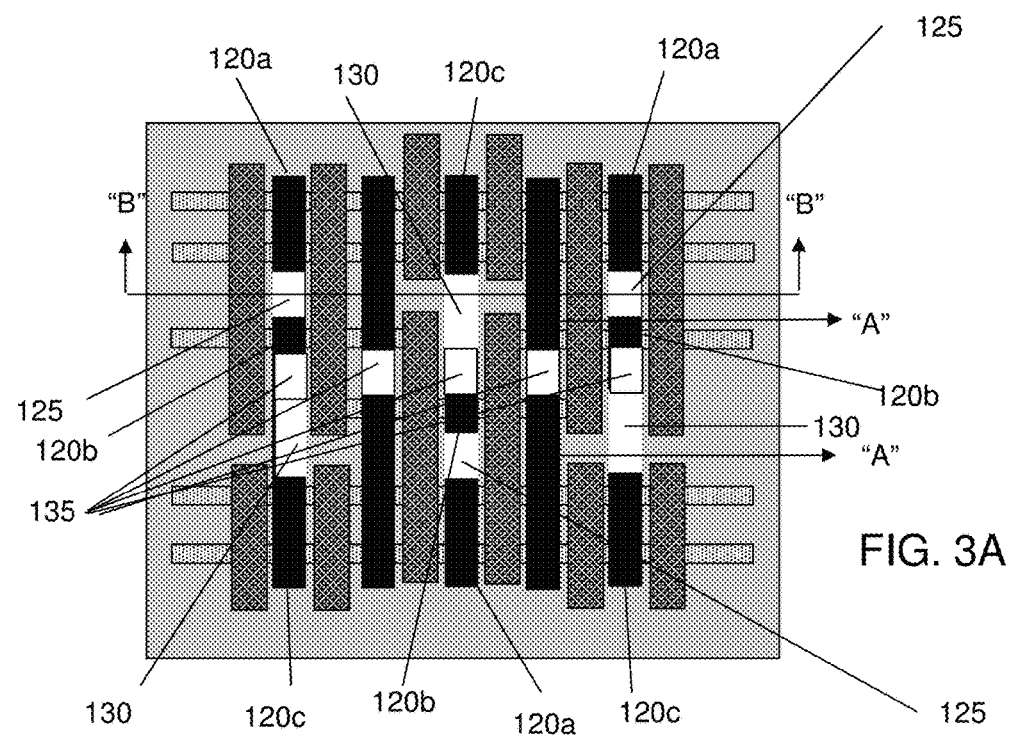
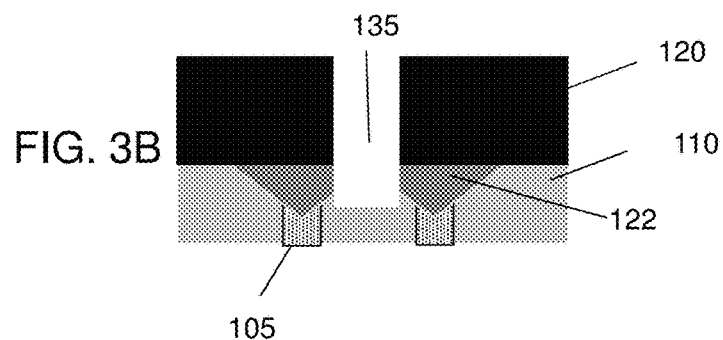
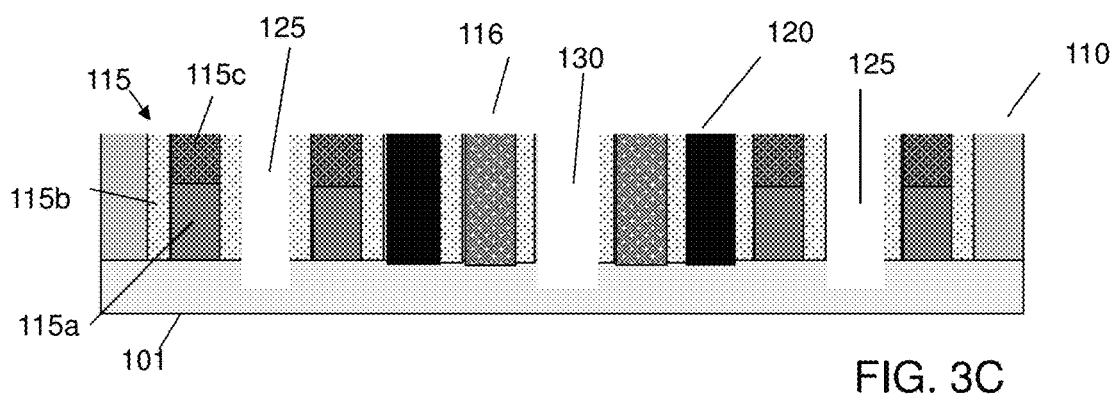

SCALED MEMORY STRUCTURES OR OTHER LOGIC DEVICES WITH MIDDLE OF THE LINE CUTS

FIELD OF THE INVENTION

The present disclosure relates to semiconductor structures and, more particularly, to scaled memory structures (or other logic device) with middle of the line cuts and methods of manufacture.

BACKGROUND

Scaling in semiconductor fabrication can be problematic, particularly in SRAM cells. For example, in SRAM cells, as the fin spacing and gate pitches become smaller, contact shorting and epitaxial merging of source and drain regions can occur. This can also occur in different types of devices.

For example, the space between an NFET device and PFET device can be 50 nm or less in smaller nodes; whereas, the space between PFET devices can be 40 nm or less in smaller nodes. This can result in epitaxial regions for the source and drains of these devices merging together. Similarly, contact spacing between the devices can be 40 nm and even 30 nm for smaller nodes, each of which present a problem associated with contacts shorting, e.g., Vdd, Vss and bitlines in SRAM cells. Tighter fins, e.g., spacing between fins, also presents problems of shorting and/or merging of epitaxial materials, leading to impaired device performance.

SUMMARY

In an aspect of the disclosure, a structure comprises: a plurality of fin structures formed on a substrate; a plurality of gate structures spanning over adjacent fin structures; a cut in adjacent epitaxial source/drain regions; and a cut in contact material formed adjacent to the plurality of gate structures, which provides separate contacts.

In an aspect of the disclosure, a method comprises: forming a plurality of fin structures; forming a plurality of gate structures spanning adjacent fin structures; forming epitaxial source and drain regions for the plurality of gate structures; forming borderless contact material first between the plurality of gate structures and spanning over the plurality of fin structures; forming a cut in the contact material to provide separate contacts; and forming, in a same step, a cut which separates the epitaxial source and drain regions for different gate structures of the plurality of gate structures and a cut which separates the epitaxial source and drain regions.

In an aspect of the disclosure, a method comprises: forming a plurality of fin structures; forming a plurality of gate structures spanning over adjacent fin structures; forming merged epitaxial source and drain regions associated with adjacent gate structures of the plurality of gate structures; forming stripes of borderless contact material between the plurality of gate structures; forming a cut to separate the merged epitaxial source and drain regions into separate epitaxial source/drain regions; and forming a cut in the stripes of the contact material to provide separate contacts.

BRIEF DESCRIPTION OF THE DRAWINGS

The present disclosure is described in the detailed description which follows, in reference to the noted plurality of drawings by way of non-limiting examples of exemplary embodiments of the present disclosure.

FIGS. 3A-3C show the memory array (or other logic device) of FIGS. 2A-2C, respectively, with multiple cuts and respective fabrication processes in accordance with aspects of the present disclosure.

DETAILED DESCRIPTION

Figure 1A:
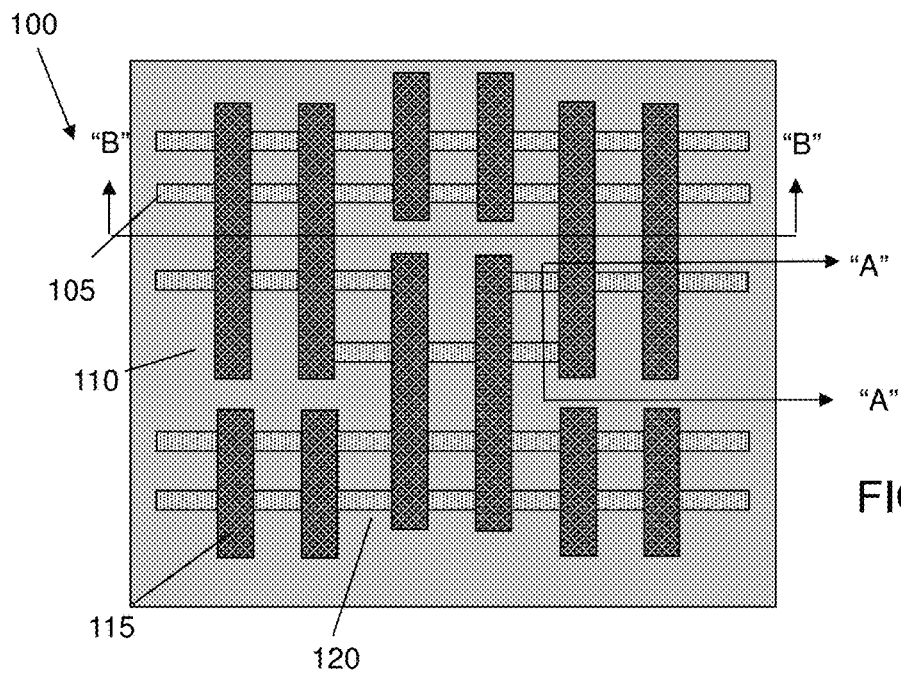
FIG. 1A shows a top plan view of an incoming memory array (or other logic device) and respective fabrication processes in accordance with aspects of the present disclosure.

The present disclosure relates to semiconductor structures and, more particularly, to scaled memory structures (or other logic device) with middle of the line (MOL) cuts and methods of manufacture. In one specific implementation, the present disclosure relates to static random access memory (SRAM) devices with MOL cuts and methods of manufacture. Advantageously, the present disclosure provides a cut process, post MOL, which eliminates contact shorts and epitaxial merge issues in scaled devices, e.g., tight spaces, especially in SRAM cells. Also, the cut processes, post MOL, provides continuous SRAM scaling (or other logic device) enablement in 7 nm and beyond.

The scaled structures described herein will have one or more cuts that reduces epitaxial mergers and contact shorts as dimensions of the structure shrink. The cuts, as described herein, will salvage contact and epitaxial shorts in tight spaces, while also allowing larger epitaxial growths on FIN structures in logic performance regions. By implementing the processes described herein, the scaled memory structures will not suffer from yield detraction in SRAM cells.

In embodiments, the cuts are provided in selective regions which are limiting SRAM scaling (or other devices), post source/drain region formation. For example, the cuts can be provided between contacts (e.g., source, drain and gate contacts) and epitaxial source and drain regions for adjacent devices, e.g., PFET-PFET and NFET-PFET, as examples. In more particular examples, the cuts can be provided in three defined areas to provide a defined separation (space) between adjacent epitaxial areas (e.g., source/drain areas between adjacent PFET devices or PFET and NFET devices), and contacts that form a device (e.g., for source/drain contacts and source/drain and gate contacts for SRAM cells). In embodiments, the cuts will effectively disconnect any epitaxial areas that would otherwise merge together during conventional fabrication processing, while also defining the contacts for Vdd, Vss and bitlines. The cuts can be filled with insulator material, e.g., dielectric material.

It should be recognized by those of skill in the art that the cuts can be provided in any order, post source/drain epitaxial growth. Accordingly, it is possible to provide cuts for the contacts prior to the cuts for the epitaxial merge. In another combination, the cuts to separate adjacent selected gates, e.g., adjacent PFET devices and NFET device, can be provided prior to or after the cut to separate the epitaxial merge. These different embodiments are described herein. In addition, the methods described herein will save considerable costs in manufacturing due to the direct cutting disclosed herein, without the need for an inversion tone loop. The processes described herein also provide improved contact RIE opening with improved tungsten fill, as well as improved self-aligned separation for contact cuts.

The structures of the present disclosure can be manufactured in a number of ways using a number of different tools. In general, though, the methodologies and tools are used to form structures with dimensions in the micrometer and nanometer scale. The methodologies, i.e., technologies, employed to manufacture the structures of the present disclosure have been adopted from integrated circuit (IC) technology. For example, the structures are built on wafers and are realized in films of material patterned by photolithographic processes on the top of a wafer. In particular, the fabrication of the structures uses three basic building blocks: (i) deposition of thin films of material on a substrate, (ii) applying a patterned mask on top of the films by photolithographic imaging, and (iii) etching the films selectively to the mask.

Figure 1B:
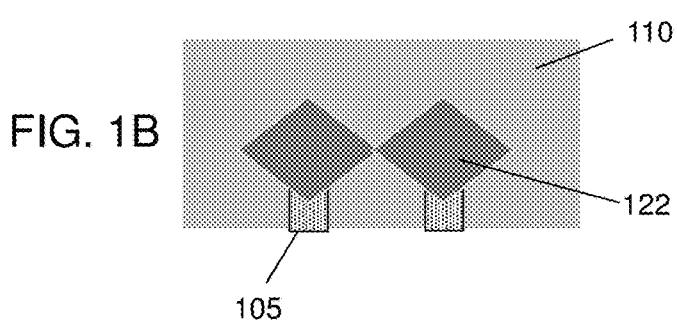
FIG. 1B shows a cross-sectional view of the memory array (or other logic device) of FIG. 1A, along line A-A.
Figure 1C:
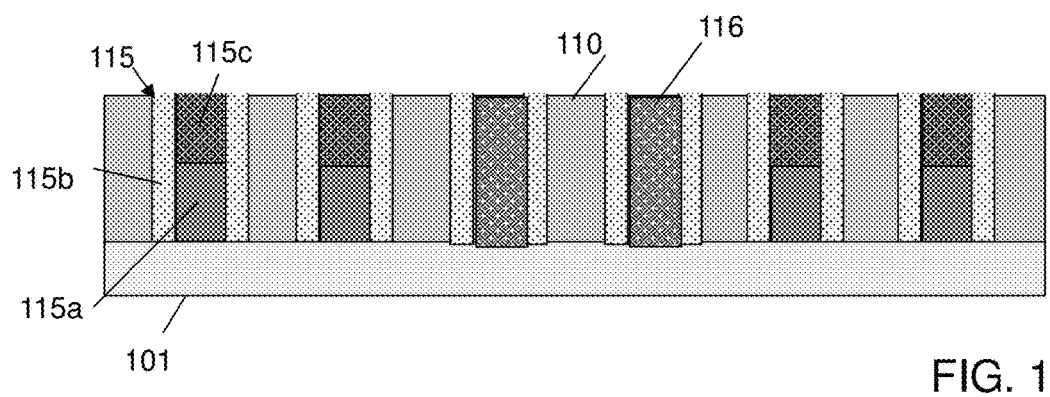
FIG. 1C shows a cross-sectional view of the memory array (or other logic device) of FIG. 1A, along line B-B.

FIG. 1A shows a top plan view of an incoming memory array (or other logic device) and respective fabrication processes in accordance with aspects of the present disclosure. FIG. 1B shows a cross-sectional review of the memory array (or other logic device) of FIG. 1A, along line A-A. FIG. 1C shows a cross-sectional review of the memory array (or other logic device) of FIG. 1A, along line B-B. As shown in these representations, the memory array 100 (or other devices) includes a plurality of fin structures 105 formed on an underlying insulator material 110. In embodiments, the fin structures 105 are composed of any suitable substrate material, e.g., Si, SiGe, SiGeC, SiC, GaAs, InAs, InP, and other III/V or II/VI compound semiconductors. In further embodiments, the fin structures 105 can be composed using silicon-on-insulator (SOI) technologies or BULK materials. The fin structures 105 are fabricated on an insulator material, e.g., buried oxide material.

In embodiments, the fin structures 105 can be fabricated using conventional sidewall image (SIT) techniques. In a SIT technique, a mandrel material, e.g., $SiO_2$, is deposited on the substrate using conventional CVD processes. A resist is formed on the mandrel material, and exposed to light to form a pattern (openings). A reactive ion etching is performed through the openings to form the mandrels. In embodiments, the mandrels can have different widths and/or spacing depending on the desired dimensions between the fin structures 105. Spacers are formed on the sidewalls of the mandrels which are preferably material that is different than the mandrels, and which are formed using conventional deposition processes known to those of skill in the art. The spacers can have a width which matches the dimensions of the narrow fin structures 105, for example. The mandrels are removed or stripped using a conventional etching process, selective to the mandrel material. An etching is then performed within the spacing of the spacers to form the sub-lithographic features. The sidewall spacers can then be stripped.

Still referring to FIGS. 1A-1C, a plurality of gate structures 115 are formed (spanning) over the fin structures 105. In embodiments, the gate structures 115 can be adjacent PFET devices or PFET and NFET devices, e.g., pass gates, pull up gates and pull down gates (e.g., transistors), as should be understood by those of skill in the art. The gate structures 115 can be formed by any conventional CMOS process, e.g., including a gate first process or gate last process. In a gate last process, for example, the gate structures 115 are formed by conventional deposition (e.g., chemical vapor deposition (CVD) processes, and patterning processes (e.g., lithography and reactive ion etching (RIE) with selective chemistries, of appropriate workfunction metals 115a, capped with a capping material 115c, e.g., nitride material. Sidewall spacers 115b are provided on sides of the patterned structures.

The gate structures 115 also include source/drain regions 122 (see, e.g., FIG. 1B). In embodiments, the source/drain regions 122 are epitaxial growths on or near the fin structures 105, which due to tight space constraints between gate structures merge together. For example, the spacing between different devices, e.g., gate structures, can range from about 30 nm to 70 nm, depending on the technology node, e.g., 7 nm, 14 nm, etc. In embodiments, the source/drain regions 122 can be raised source/drain regions, as an example, doped with impurities, e.g., arsenic, phosphorous, boron, etc.

In embodiments, the gate structures 115 can be cut by conventional lithography and etching processes. In embodiments, dummy gate material can be removed and isolation material 116 can be deposited. The isolation material 116 can be a nitride material, low-k material or other insulator material. In addition, shallow trench isolation (STI) regions 101 can be formed using conventional lithography, etching and deposition methods, as is known to one of skill in the art. The STI regions 101 can be an oxide or other insulator material, formed between the gate structures 115 and isolation material 116.

Figure 2A:
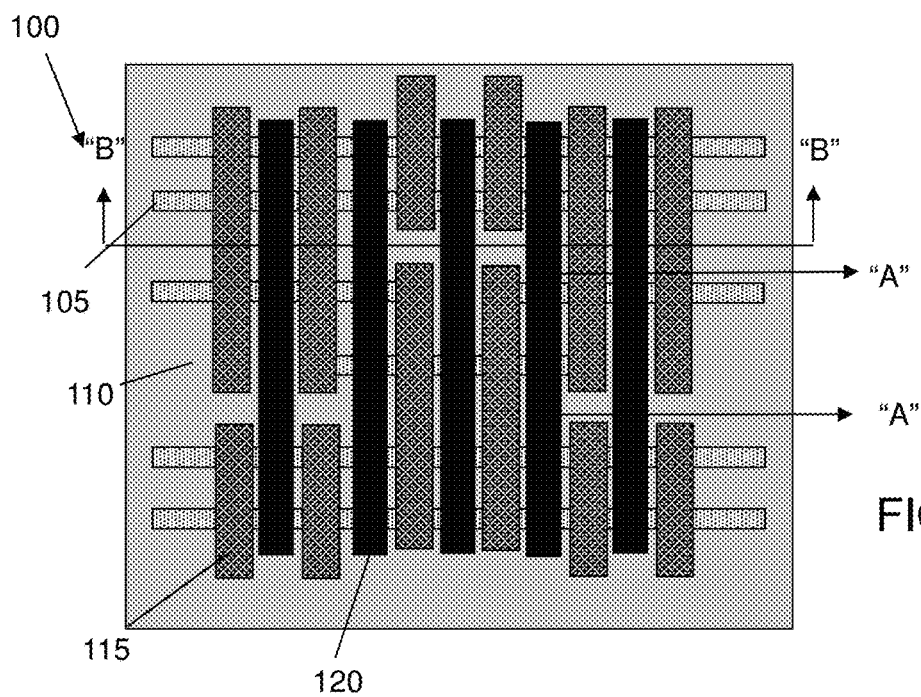
FIGS. 2A-2C show the memory array (or other logic device) of FIGS. 1A-1C, respectively, with contact formation and respective fabrication processes in accordance with aspects of the present disclosure.
Figure 2B:
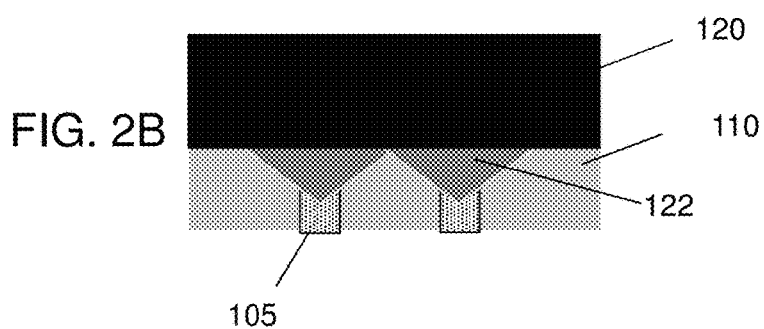
Figure 2C:
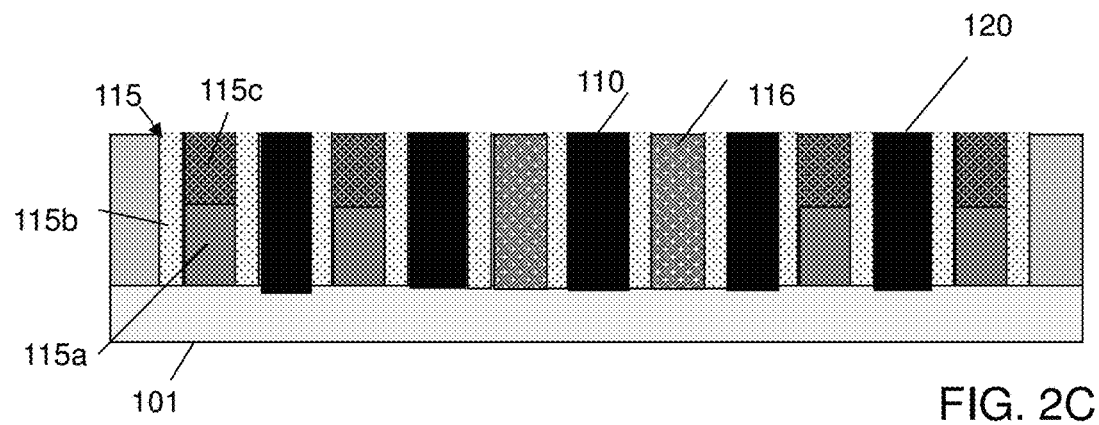

In FIGS. 2A-2C, contact material 120 is formed over the fin structures 105, adjacent to respective gate structures 115. In embodiments, the contact material 120 can be tungsten, which is deposited into stripes. In embodiments, the contact material 120 can be other metal or metal alloy material such as, e.g., aluminum or copper. The stripes can be formed by conventional, lithography, etching processes and deposition and CMP as described herein. The stripes are further patterned (as described herein) to form contacts, e.g., Vss contacts, Vdd contacts, bitline contacts and node contacts for SRAM cells, and all contacts for other logic circuits In this particular embodiment, the contact material 120 is patterned into borderless stripes between the adjacent gate structures 120. To form the borderless stripes of contact material 120, conventional deposition and patterning techniques are used. For example, a resist mask formed over the insulator material is exposed to energy (light) to form a pattern (stripes). An etching process with a selective chemistry, e.g., reactive ion etching (RIE), will be used to pattern the insulator material into stripes. After the resist is removed, metal material is deposited in the stripes. Any residual material can be removed by a conventional chemical mechanical process (CMP). In later processing steps, the metal material can be further processed into Vdd, Vss and bitline contacts.

Prior to forming the borderless contacts, a silicide can be formed on the underlying contact areas. As should be understood by those of skill in the art, the silicide process begins with deposition of a thin transition metal layer, e.g., nickel, cobalt or titanium, over fully formed and patterned semiconductor devices (e.g., doped or ion implanted source and drain regions and respective devices). After deposition of the material, the structure is heated allowing the transition metal to react with exposed silicon (or other semiconductor material as described herein), in the active regions of the semiconductor device (e.g., source, drain, gate contact region) forming a low-resistance transition metal silicide. Following the reaction, any remaining transition metal is removed by chemical etching, leaving silicide contacts in the active regions of the device. It should be understood by those of skill in the art that silicide contacts will not be required on the devices, when a gate structure is composed of a metal material.

FIGS. 3A-3C show the memory array (or other logic device) of FIGS. 2A-2C, respectively, with multiple patterning and cuts and respective fabrication processes in accordance with aspects of the present disclosure. More specifically, as shown in FIGS. 3A-3C, a cut 125 is performance to cut off the contacts material between Vdd and Vss, and continues to overetch to separate the merged source/drain regions 122. In addition, a cut 130 removes conductive material between bitline and Vdd, as well as the merged source/drain regions 122. As further shown, a cut 135 removes conductive material between selected gates, e.g., adjacent PFET devices and adjacent NFET in the SRAM and contacts in other logic devices, and continues to etch down to separate merged epitaxial source/drain regions 122. It should be understood, though, that the cuts 125, 130 and 135, or more or less cuts can be formed in other locations, noting that it is preferable that cuts are formed through the merged epitaxial source/drain regions to ensure separation thereof as shown in FIG. 3B.

In embodiments, the cuts 125, 130, 135 are provided post source/drain contact formation, and can be performed in any order or any combination. In addition, additional cuts can be provided between different devices or for different contacts in the manner recited herein, e.g., post epitaxial merge formation. In embodiments, also, each of the cuts continue to an epitaxial etch, underlying the contacts. Also, the epitaxial etch can be a slight over etch provided into an underlying oxide material.

By way of illustrative, non-limiting example, the cuts 125, 130, 135 are formed by separate conventional lithography and etching processes as described herein. For example, by selectively opening a lithography mask, e.g., resist, by exposure to energy, it is possible to etch the stripes of contact material 120 to form Vss contacts 120a and Vdd contacts 120b for the different gate structures in SRAM, and other contacts in logic with a defined separation as provided by the cut 125. In addition, it is possible to continue to etch the underlying merged source/drain regions 122, providing a separation for possible merged epitaxial regions. In embodiments, the cuts 130 separate the contact material into the separate bitline contacts 120c and Vdd contacts 120b from the metal material 120 in SRAM and other contacts in logic circuits, and continues to etch down to separate epitaxial regions as shown by the defined separation provided by the second cut 130. In further embodiments, the cuts 135 are provided post source/drain contact formation to provide a space between adjacent selected gates, e.g., adjacent PFET devices and NFET device, amongst other devices.

Figure 4A:
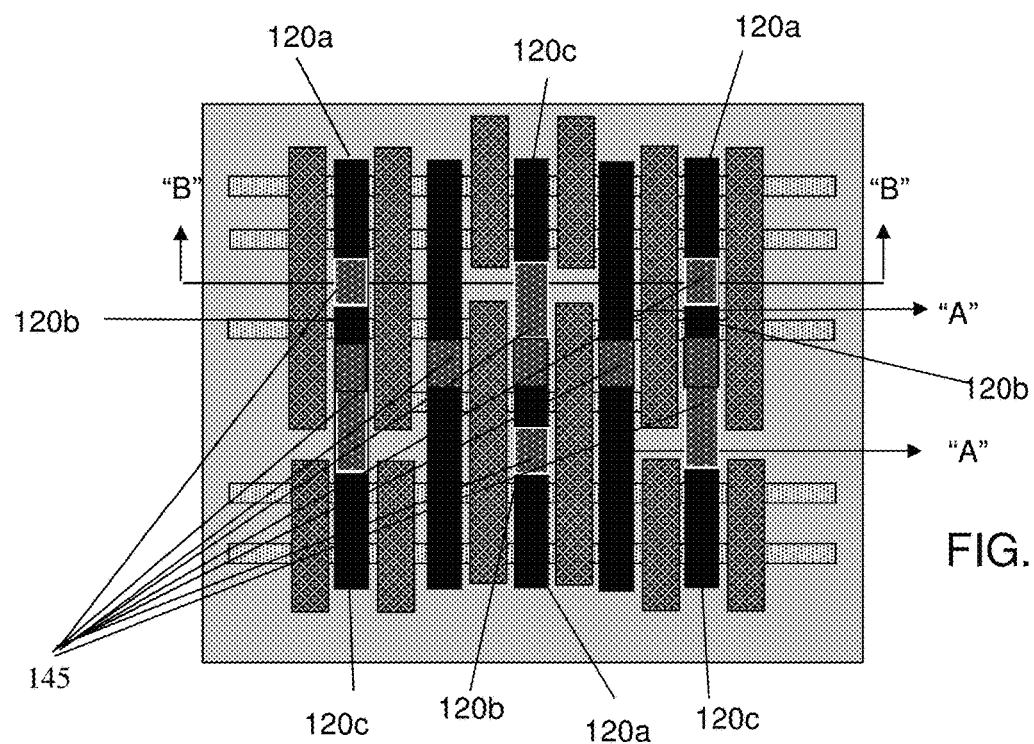
FIGS. 4A-4C show the memory array (or other logic device) of FIGS. 3A-3C, respectively, with dielectric fill material within the multiple cuts and respective fabrication processes in accordance with aspects of the present disclosure.
Figure 4B:
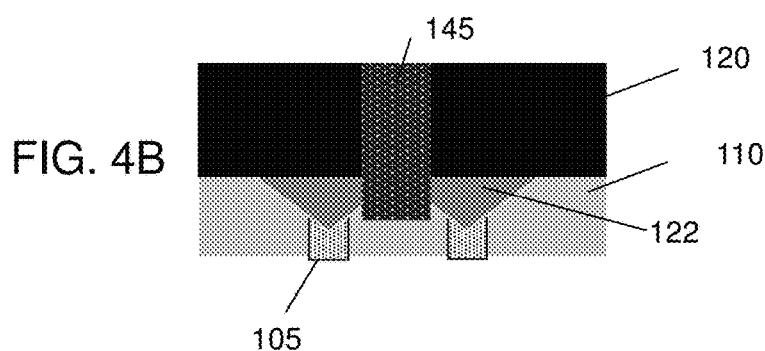
Figure 4C:
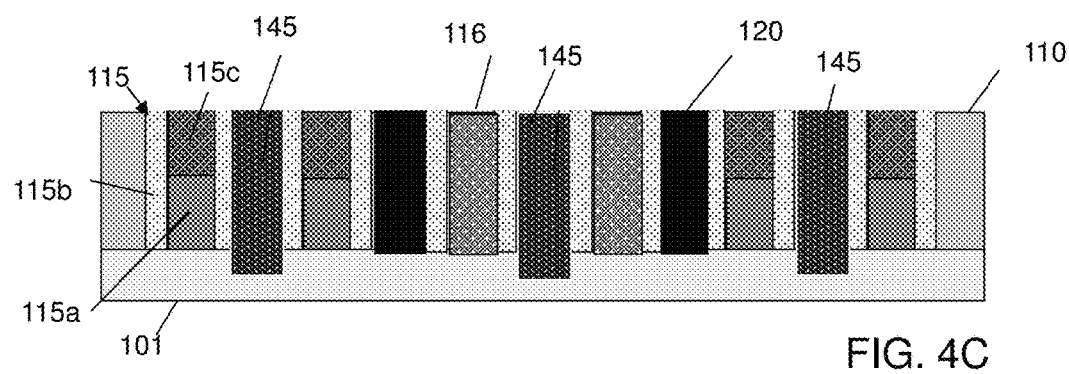

FIGS. 4A-4C show the memory array (or other logic device) of FIGS. 3A-3C, respectively, with dielectric fill material filling the cuts 125, 130, 135. More specifically, in embodiments, the cuts 125, 130, 135 are optionally filled with a dielectric material 145, e.g., low K, oxide based material or other material, using a conventional deposition process, e.g., CVD. Following the deposition process, the dielectric material 145 can be planarized using a conventional CMP process.

The method(s) as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The descriptions of the various embodiments of the present disclosure have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed:

1. A structure, comprising:
   a plurality of fin structures formed on a substrate;
   a plurality of gate structures spanning over adjacent fin structures of the plurality of fin structures;
   a cut in merged epitaxial source/drain regions which provides separate epitaxial source/drain regions for each of the plurality of gate structures;
   a cut in merged contact material formed adjacent to the plurality of gate structures, the cut resulting in separate contacts for each separate epitaxial source/drain regions; and
   dielectric material filling each of the cuts in the contact material and the epitaxial source/drain regions.

2. The structure of claim 1, wherein the structure is a static random access memory (SRAM) cell or a logic device.

3. The structure of claim 1, wherein the cuts are performed in any order.

4. The structure of claim 1, wherein the separate epitaxial source/drain regions are epitaxial material on adjacent sides of the plurality of fin structures.

5. The structure of claim 1, wherein the cut in the merged epitaxial source/drain regions and the cut in the merged contact material are a single, aligned cut.

6. The structure of claim 5, wherein the substrate is an insulator material under the plurality of fin structures and the single, aligned cut extends into the insulator material.

7. The structure of claim 6, wherein the plurality of fin structures are adjacent fin structures with respect to their lengths and are in a parallel side by side configuration, wherein the single, aligned cut is between the adjacent fin structures.

8. The structure of claim 7, wherein a spacing between the plurality of gate structures range from about 30 nm to 70 nm.

9. The structure of claim 7, wherein the separate contacts are borderless stripes of contact material between the adjacent gate structures.

10. The structure of claim 9, wherein the cuts to form the separate contacts cut off the contacts material between Vdd and Vss.

11. The structure of claim 10, wherein the cuts to form the separate contacts cut off the merged contact material between Vdd and Vss.

12. The structure of claim 11, wherein the cut to form the separate contacts is an over etch of the cut that separates the merged epitaxial source/drain regions.

13. The structure of claim 12, wherein the cut to form the separate contacts removes conductive material between a bitline and Vdd, as well the merged epitaxial source/drain regions.

14. The structure of claim 13, wherein the dielectric material is a low K material which is planar with a top surface of the contact materials.

* * * * *